(12) United States Patent
Ueshima

(10) Patent No.: US 8,343,383 B2
(45) Date of Patent: Jan. 1, 2013

(54) ANISOTROPIC CONDUCTIVE MATERIAL

(75) Inventor: Minoru Ueshima, Matsudo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 476 days.

(21) Appl. No.: 12/450,126

(22) PCT Filed: Mar. 12, 2008

(86) PCT No.: PCT/JP2008/054517
§ 371 (c)(1),
(2), (4) Date: Nov. 4, 2009

(87) PCT Pub. No.: WO2008/111615
PCT Pub. Date: Sep. 18, 2008

(65) Prior Publication Data
US 2010/0053924 A1    Mar. 4, 2010

(30) Foreign Application Priority Data
Mar. 12, 2007   (JP) ................ 2007-061233

(51) Int. Cl.
*H01B 1/02*   (2006.01)

(52) U.S. Cl. ...................... 252/512; 252/514
(58) Field of Classification Search .......... 252/512–514, 252/518.1; 156/60
See application file for complete search history.

(56) References Cited

U.S. PATENT DOCUMENTS

| 3,974,105 | A |   | 8/1976 | Sato et al. ............ 252/512 |
| 5,573,602 | A | * | 11/1996 | Banerji et al. .......... 148/24 |
| 6,121,689 | A |   | 9/2000 | Capote et al. ........... 257/783 |
| 6,802,446 | B2 | * | 10/2004 | Chaudhuri et al. ...... 228/248.1 |
| 7,169,209 | B2 | * | 1/2007 | Nakata et al. .......... 75/255 |
| 2005/0126339 | A1 |   | 6/2005 | Shimizu et al. ......... 75/331 |

FOREIGN PATENT DOCUMENTS

| EP | 1333079 | 8/2003 |
| EP | 1615263 | 1/2006 |
| EP | 1914035 | 4/2008 |
| JP | 08186156 | 7/1996 |
| JP | 10112473 | 4/1998 |
| JP | 11176879 | 7/1999 |
| JP | 11186334 | 7/1999 |
| JP | 2002026070 | 1/2002 |
| JP | 2002117721 | 4/2002 |
| JP | 2002217239 | 8/2002 |
| JP | 2006108523 | 4/2006 |
| JP | 2006199833 | 8/2006 |

* cited by examiner

*Primary Examiner* — Mark Kopec
(74) *Attorney, Agent, or Firm* — Michael Tobias

(57) ABSTRACT

An anisotropic conductive material contains low melting point electrically conductive particles in a thermosetting resin. The low melting point particles have a solidus temperature of at least 125° C., a peak temperature of at most 200° C., and a temperature difference between the solidus temperature and the peak temperature of at least 15° C. The maximum particle diameter of the low melting point particles is smaller than ¼ of the spacing between adjoining conductors atop which the anisotropic conductive material is to be disposed.

11 Claims, 3 Drawing Sheets

ANISOTROPIC CONDUCTIVE MATERIAL

TECHNICAL FIELD

This invention relates to an anisotropic conductive material which contains electric-conductive particles in a thermosetting insulating resin and particularly to an anisotropic conductive material which can be used for bonding of liquid crystal devices and LCD's of plasma displays to printed circuits such as FPC's and printed circuit boards.

BACKGROUND ART

Liquid crystal devices such as LCD's have poor heat resistance. When they are bonded to FPC's (flexible printed circuits), an anisotropic conductive material such as an anisotropic electric-conductive adhesive is used. The anisotropic conductive material achieves thermocompression bonding and which comprises a binder component in the form of a thermosetting resin such as an epoxy resin and electric-conductive particles such as Ni particles. This anisotropic conductive material, which comprises a thermosetting insulating resin in which spherical electrically conductive particles are dispersed, is sandwiched between opposing substrates. By applying pressure in the thickness direction while heating, anisotropy is achieved in which there is electrical conductivity in the vertical direction and insulating properties between adjoining conductors in the horizontal direction.

The state in which substrates are bonded to each other using an anisotropic conductive material will be explained. FIG. 1 is a schematic view for explaining the state before bonding of substrates to each other, and FIG. 2 is an explanatory view for explaining the state after bonding.

As shown in FIG. 1, a plurality of conductors 2 are formed on a lower substrate 1, and a plurality of conductors 4 are formed on an upper substrate 3, which is bonded to the lower substrate, in the same location as the conductors 2 of the lower substrate. The lower substrate 1 and the upper substrate 3 are positioned so that the corresponding conductors 2 and 4 are aligned, and an anisotropic electrically conductive film 5 which is an anisotropic conductive material is sandwiched between the lower substrate 1 and the upper substrate 3. A large number of electric-conductive particles 7 are dispersed in a thermosetting resin 6 of the anisotropic electrically conductive film 5.

As shown in FIG. 2, when a heater block 8 is disposed atop the upper substrate 2 and presses downwards while heating, thermocompression bonding takes place, and the anisotropic conductive film 5 softens and is sandwiched between the upper and lower conductors 2 and 4. At this time, the electric-conductive particles 7 which are sandwiched between the upper and lower conductors contact the upper and lower conductors 2 and 4 and can conduct between the conductors. If heating further proceeds, the thermosetting resin 6 liquefies and adheres the lower substrate 1 and the upper substrate 3 to each other. The electric-conductive particles between the adjoining conductors are surrounded by the thermosetting resin and do not contact each other, and they are present in the thermosetting resin without conducting. If heating by the heater block 8 is continued and the curing temperature of the thermosetting resin is reached, the thermosetting resin 6 is cured and the upper and lower substrates are securely bonded to each other. This is the bonding mechanism of substrates using an anisotropic conductive material.

Electric-conductive particles used in anisotropic conductive materials include high melting point particles and low melting point particles. High melting point particles include metallic particles of gold, silver, nickel, and the like, as well as non-metallic particles of ceramics or plastics having a surface coating of nickel, gold, or the like. These high melting point particles do not melt at the time of thermocompression bonding and maintain a spherical shape after bonding. Low melting point particles include Pb-63Sn, Pb-5Sn, Sn-3.5Ag, Sn—In, Sn—Cu, Sn—Ag, Sn—Zn, Sn—Zn—Bi, Sn—Ag—Bi, Sn—Ag—Bi—In, and the like. Low melting point particles melt at the time of thermocompression bonding. (Patent Documents 1-7)

In an anisotropic conductive material, the electric-conductive particles conduct between upper and lower conductors, but there is a great difference between high melting point particles and low melting point particles with respect to the state of the electric-conductive particles when they are conducting. Here, the state in which high melting point particles or low melting point particles are conducting between conductors will be explained.

FIG. 3 shows the state of conduction between upper and lower electrodes with high melting point particles. When high melting point particles 7(K) which are positioned in the space 9 between the conductors 2 of the lower substrate 1 and the conductors 4 of the upper substrate 3 undergo thermocompression bonding in a thermocompression bonding apparatus, first, when the thermosetting resin 6 softens, the high melting point particles 7(K) push the thermosetting resin 6 out of the way and reach the conductors 2 and 4, and the high melting point particles 7(K) contact and conduct between the conductors 2 and 4. Since this contact is contact between the planar conductors and the spherical high melting point particles, it is point contact in which a portion of a sphere contacts a plane. When the temperature is further increased and the thermosetting resin liquefies, the liquefied thermosetting resin adheres to the upper and lower substrates 1 and 3. As heating progresses and the curing temperature of the thermosetting resin is reached, the thermosetting resin cures and firmly bonds the upper and lower substrates 2 and 4 to each other. At this time, the high melting point particles 7(K) in the spaces 10 between adjoining conductors are not contacting the conductors, so they do not affect conduction.

FIG. 4 shows the state of conduction between upper and lower conductors when using low melting point particles. When the low melting point particles 7(T) disposed in the space 9 between a conductor 2 of the lower substrate 1 and a conductor 4 of the upper substrate 3 are subjected to thermocompression bonding in a thermocompression bonding apparatus, first, when the thermosetting resin 6 softens, the low melting point particles 7(T) push the thermosetting resin 6 out of the way and reach the upper and lower conductors 2 and 4, and the low melting point particles 7(T) contact the conductors 2 and 4. If the temperature further increases, the liquefied thermosetting resin adheres to the upper and lower substrates 1 and 3, the low melting point particles 7(T) melt, and they wet the conductors 2 and 4 which they are contacting and are metallically bonded to the conductors. At this time, the low melting point particles 7(T) in the spaces 10 between adjoining conductors melt, but they are not contacting the conductors. Therefore, they maintain a spherical shape due to surface tension. If the temperature is further increased and the curing temperature of the thermosetting resin is reached, the thermosetting resin cures and strongly bonds the upper and lower substrates 2 and 4 to each other. When heating by the thermocompression bonding apparatus is ceased, the low melting point particles solidify and completely metallically bond the upper and lower conductors 2 and 4 to each other.

Low melting point particles are superior to high melting point particles with respect to reliability after bonding with an anisotropic conductive material. This is because of the state of bonding between the particles and the conductors. Namely, conduction by high melting point particles is conduction due to the above-described point contact between the high melting point particles and the conductors. In this state, poor contact sometimes takes place. This is because after the upper and lower conductors are bonded with the anisotropic conductive material, if the members which are bonded, i.e., the substrates warp or twist, the strains which they experience are transmitted to the anisotropic conductive material, and the high melting point particles and the conductors which had been in point contact separate from each other. In addition, if electronic equipment which includes a substrate bonded using an anisotropic conductive material also includes devices such as transformers or power transistors which generate heat during use, the interior of a case of the electronic equipment reaches a high temperature during operation, and when operation is stopped, the interior of the case returns to room temperature. When the interior returns to room temperature, condensation takes place everywhere inside the electronic equipment. If moisture due to this condensation penetrates into the anisotropic conductive material, the resin in the anisotropic conductive material swells, and the swelling causes defective contact between the high melting point particles and the conductors in the same manner as the above-described warping or twisting of the substrate.

On the other hand, since low melting point particles are strongly metallically bonded to the conductors, the conductors and the low melting point particles do not readily separate from each other even if a substrate warps or twists or if a resin in the anisotropic conductive material swells due to moisture. This is why an anisotropic conductive material using low melting point particles has superior reliability compared to an anisotropic conductive material using high melting point particles.

Patent Document 1: JP H8-186156 A
Patent Document 2: JP H10-112473 A
Patent Document 3: JP H11-176879 A
Patent Document 4: JP H11-186334 A
Patent Document 5: JP 2002-26070 A
Patent Document 6: JP 2002-217239 A
Patent Document 7: JP 2006-108523 A

DISCLOSURE OF INVENTION

Problem which the Invention is to Solve

As described above, an anisotropic conductive material using low melting point particles is superior to one using high melting point particles, but a conventional anisotropic conductive material using low melting point particles has problems such as a large contact resistance between the upper and lower conductors or a low insulation resistance between adjoining conductors. The present invention provides an anisotropic conductive material which solves the problems of conventional electrically conductive materials using low melting point particles.

Means for Solving the Problem

The present inventors conducted diligent investigations concerning the problems of conventional anisotropic conductive materials using low melting point particles (referred to below simply as anisotropic conductive materials), and they found that the fluidity of low melting point particles when they melt has a major effect. With a conventional anisotropic conductive material, when a thermosetting resin is heated, the resin softens and then liquefies, and as heating further proceeds and the curing temperature is reached, the resin cures. Before the thermosetting resin cures, the low melting point particles melt, flow inside the liquefied thermosetting resin, and wet the conductors to thereby perform bonding. It was thought that low melting point particles having good fluidity were suitable with an anisotropic conductive material employing this bonding mechanism in order to make the low melting point particles rapidly become fluid and wet the conductors before curing of the thermosetting resin.

In general, a low melting point alloy is a eutectic composition alloy having no solidification range between its solidus temperature and its liquidus temperature. Even if it is not a eutectic composition, it is a composition having an extremely narrow solidification range between its solidus temperature and its liquidus temperature so that the alloy will have good fluidity. In the past, low melting point particles used in an anisotropic conductive material were eutectic compositions such as Pb-63Sn (eutectic point of 183° C.), Sn-58Bi (eutectic point of 139° C.), Sn-52In (eutectic point of 117° C.), Sn-3.5Ag (eutectic point of 221° C.), or the like, or compositions having a narrow solidification range and good fluidity such as Sn-3Ag-0.5Cu (solidus temperature of 217° C., liquidus temperature of 221° C., solidification range of 4° C.).

However, the fluidity of an anisotropic conductive material using low melting point particles having a eutectic composition or a narrow solidification range is too good. Therefore, at the time of thermocompression bonding, the low melting point particles move into the spaces between adjoining conductors together with the resin which is pushed out from the spaces between upper and lower conductors into the spaces between adjoining conductors. As a result, the number of low melting point particles present between the upper and lower conductors become small, the connection resistance between the lower and upper conductors increases, and the number of low melting point particles present in the spaces between adjoining conductors become large and the insulation resistance of the spaces between adjoining conductors became small.

The present inventors realized that the above-described problems occur because the low melting point particles flow at the point in time at which a conventional anisotropic conductive material experiences liquefaction of the thermosetting resin. Therefore, if the low melting point particles can be prevented from flowing until the curing temperature of the thermosetting resin is reached, namely, if the low melting point particles do not completely melt prior to curing of the resin, the low melting point particles do not flow and the above-described problems do not occur at all.

The present invention is an anisotropic conductive material containing a large number of electric-conductive particles in a thermosetting resin, characterized in that the electric-conductive particles are low melting point particles having a solidus temperature measured with a DSC of at least 125° C. and a peak temperature of at most 200° C., and the temperature difference between the solidus temperature and the peak temperature is at least 15° C.

The melting temperature of electric-conductive particles in an anisotropic conductive material according to the present invention has a solidus temperature of at least 125° C. This is because the temperature at which a thermosetting resin such as an epoxy resin completely liquefies is around 120° C., a thermosetting resin such as an epoxy resin is often at a temperature of 150° C. in thermal curing. Thus, if the solidus temperature is at least 125° C., reliability can be maintained even during use in places which are exposed to a high temperature such as vehicle parts or power supply circuits. In addition, the melting temperature of electric-conductive particles in an anisotropic conductive material according to the present invention has a peak temperature of at most 200° C. A thermosetting resin, e.g., an epoxy resin is cured under conditions such as 30 minutes at 150-180° C. Therefore, with an anisotropic conductive material having a melting temperature such that the peak temperature of electric-conductive particles is at most 200° C., it is possible to adequately melt the electric-conductive particles at the curing temperature of an epoxy resin. This temperature condition is the same for other thermosetting resins such as phenolic resins.

The present invention finds the optimum range for a low melting point solder when using an adhesive which is a thermosetting resin, such as an epoxy resin, as a binder. Low melting point particles used in the present invention must have a temperature difference between their solidus temperature and their peak temperature of at least 15° C. If the temperature difference is smaller than 15° C., the low melting point particles melt all at once at the time of heating, low melting point particles sandwiched between the upper and lower conductors are pushed out, the amount of low melting point particles between the conductors decreases, and the connection resistance between the conductors becomes large.

EFFECTS OF THE INVENTION

An anisotropic conductive material according to the present invention adequately metallically bonds electric-conductive particles and conductors to each other. Therefore, even if a bonded substrate warps or twists or if the resin in the anisotropic electrically conductive material swells due to moisture, the particles do not peel from the conductors. In addition, an anisotropic electrically conductive material according to the present invention has a large temperature difference between the solidus temperature and the peak temperature of electric-conductive particles. Thus, even if the liquefied thermosetting resin is pressed out towards the spaces between adjoining conductors at the time of thermocompression bonding, the electric-conductive particles are in a half-molten state having poor fluidity and do not flow into the spaces between adjoining conductors. As a result, an anisotropic conductive material according to the present invention provides excellent effects not provided by a conventional anisotropic conductive material of increasing the electrical conductivity between upper and lower electrodes and providing a large insulation resistance between adjoining conductors.

Figure 1:
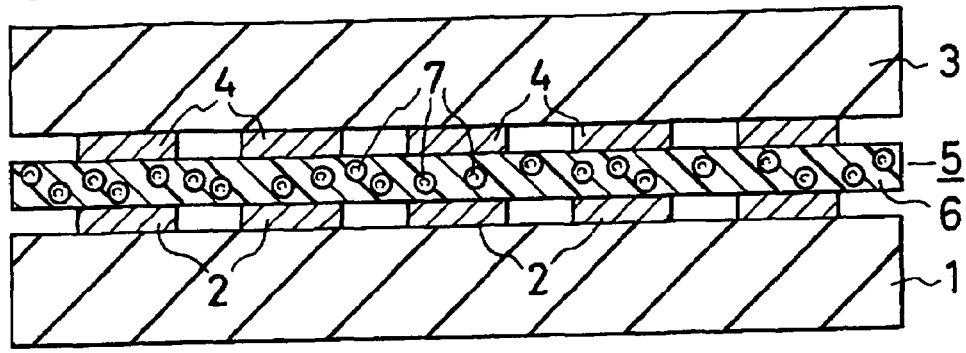
FIG. 1 is a schematic view of an anisotropic conductive material before bonding.
Figure 2:
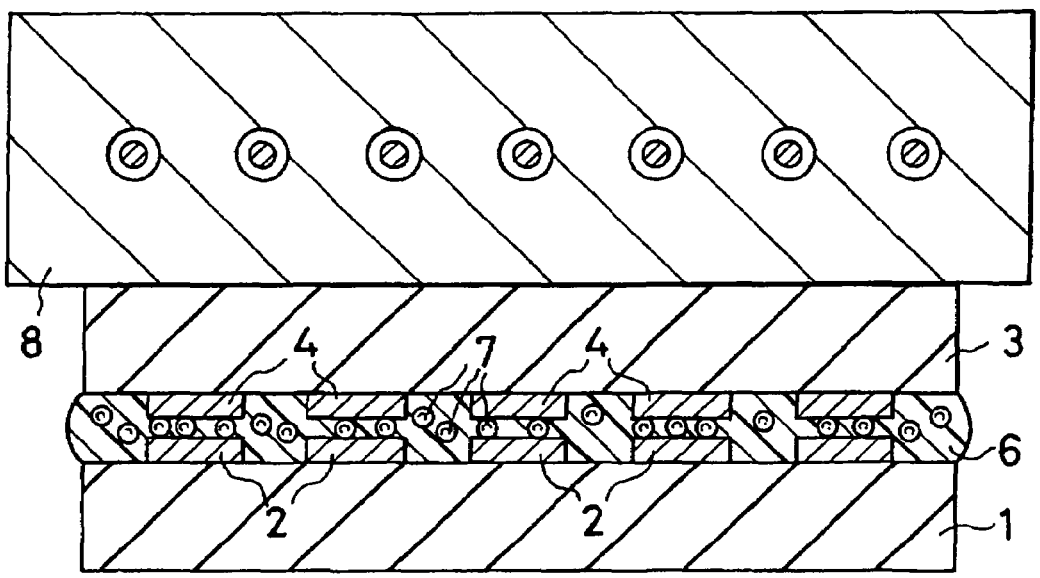
FIG. 2 is a schematic view of an anisotropic conductive material after bonding.
Figure 3:
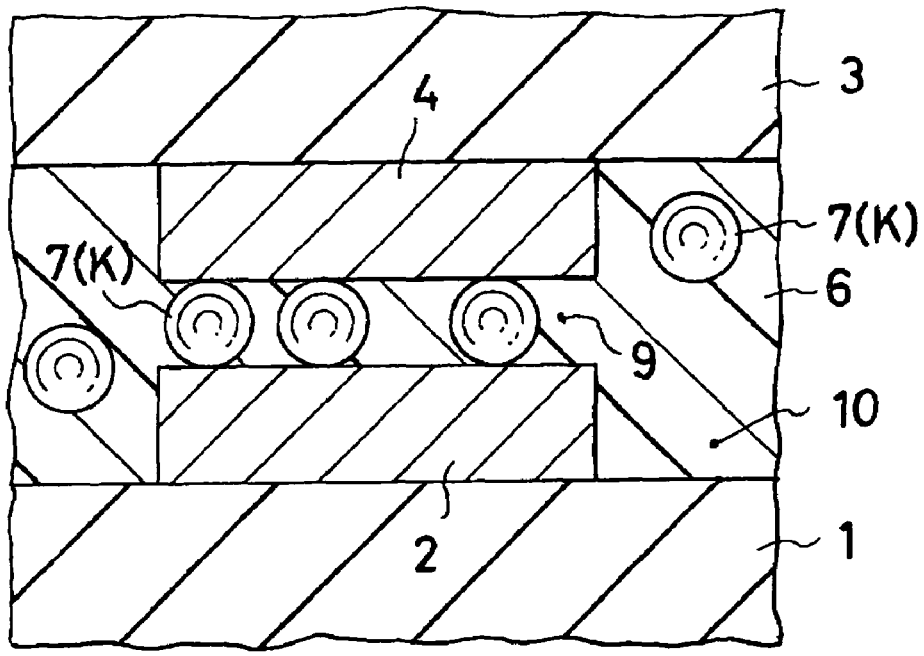
FIG. 3 is an explanatory view of the state of bonding of high melting point electric-conductive particles.
Figure 4:
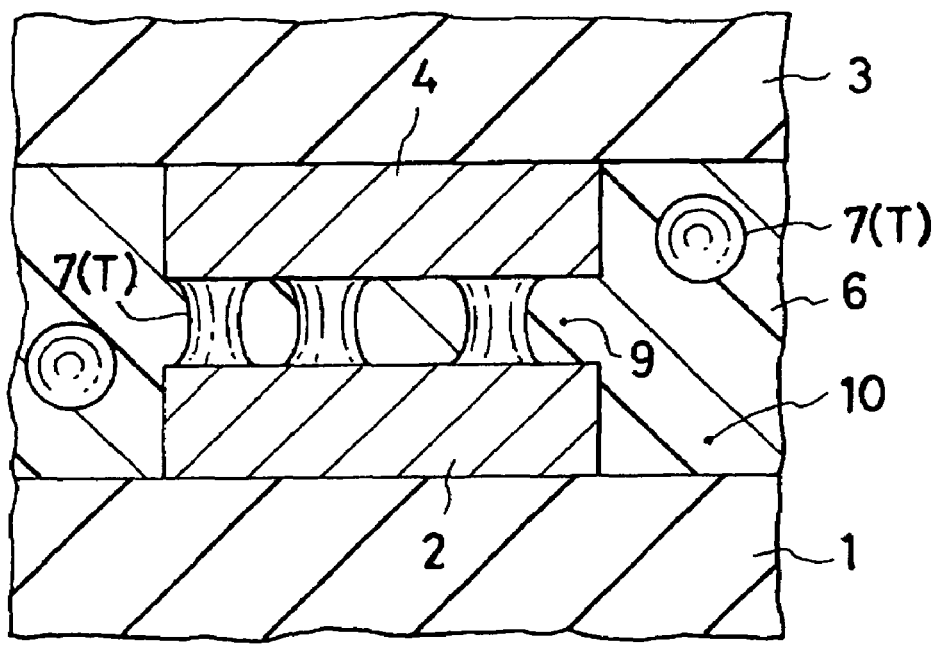
FIG. 4 is an explanatory view of the state of bonding of low melting point electric-conductive particles.

EXPLANATION OF SYMBOLS 1 lower substrate
2 conductor
3 upper substrate
4 conductor
5 anisotropic conductive material
6 thermosetting resin
7 electric-conductive particles

BEST MODE FOR CARRYING OUT THE INVENTION

The solidus temperature and the peak temperature in the present invention are the phase transformation temperatures measured using a differential scanning calorimeter (DSC) employed in thermal analysis of metals. The peak temperature is the temperature between the solid phase and the liquid phase at which heat absorption is the largest. With a metal having large heat absorption at the peak temperature, the solid phase has almost completely melted at the peak temperature, and the peak temperature is essentially the liquidus temperature. Accordingly, the liquidus temperature is not used in the present invention, and the peak temperature, which is easy to understand in practical use, is employed instead.

If low melting point particles used in the present invention are mostly unmelted at the peak temperature, the fluidity of the low melting point particles is impaired and conductivity defects occur, particularly with low pressure bonding. In the present invention, if the solidus temperature is lower than 125° C., when bonded portions are exposed to a high temperature after bonding, the bonded portions remelt and the bonded portions are separated from each other and cause bonding defects.

If the peak temperature of the low melting point particles used in the present invention is higher than 200° C., since curing of a thermosetting resin begins at 200° C. or below, the thermosetting resin cures before the low melting point particles have completely melted, and metallic bonding of the particles to the conductors cannot take place.

The temperature difference between the solidus temperature and the peak temperature of low melting point particles used in the present invention is defined as being at least 15° C. If this temperature difference is smaller than 15° C., the low melting point particles melt all at once at the time of heating, the low melting point particles sandwiched between the upper and lower conductors are swept away, the amount of low melting point particles between the conductors become small, and the connection resistance between conductors becomes large.

Preferred low melting point particles for use in the present invention are made of Sn—Ag—In based alloys or Sn—Bi based alloys. An example of the composition of a Sn—Ag—In based alloy is 1-9 mass % of Ag, 13-22 mass % of In, and a remainder of Sn. The solidus temperature of this composition is at least 125° C., the peak temperature is at most 200° C., and the temperature difference between the solidus temperature and the peak temperature is at least 15° C. A preferred composition of a Sn—Ag—In based alloy used in the present invention is Sn-3.5Ag-20In. The solidus temperature of this composition is 144° C., the peak temperature is 189° C., and the temperature difference is 45° C.

In a Sn—Ag—In based alloy, Ag has the effect of lowering the peak temperature. If the added amount of Ag is less than 1 mass %, the peak temperature of the alloy ends up being 200° C. or above. However, if the added amount of Ag is larger than 9 mass %, Ag—Sn intermetallic compounds remain at 200° C. and meltability worsens. In lowers the solidus temperature of a Sn-based composition, but if the In content is less than 13 mass %, the peak temperature cannot be decreased to 200° C. or less even if Ag is added. If the added amount of In exceeds 22 mass %, the solidus temperature ends up being lower than 125° C.

A Sn—Ag—In based alloy used in the present invention may contain other elements added to this ternary alloy. As other elements, Cu, Ni, Cr, and Fe can be added with the object of improving the mechanical properties of the ternary alloy, Ge and P can be added with the object of preventing surface oxidation of low melting point particles, and Bi and Zn can be added with the object of adjusting the melting temperature. Zn can also be added to this ternary alloy with the object of increasing wettability with respect to conductors. The amount of other elements added to a Sn—Ag—In based alloy is at most 1 mass % of at least one type. If the added amount exceeds 1 mass %, the peak temperature becomes higher than 200° C., the solidus temperature becomes lower than 125° C., and wettability with respect to conductors is worsened.

An example of the composition of a Sn—Bi based alloy is 25-75 mass % of Bi and a remainder of Sn. An alloy having this composition which is employed is one having a solidus temperature of at least 125° C., a peak temperature of at most 200° C., and a temperature difference between the solidus temperature and the peak temperature of at least 15° C. A preferred composition of a Sn—Bi based alloy used in the present invention is Sn-25Bi. The solidus temperature of this composition is 139° C., the peak temperature is 194° C., and the temperature difference is 55° C.

In a Sn—Bi based alloy, Bi has the effect of lowering the solidus temperature and the peak temperature. However, if the added amount is less than 25 mass % or greater than 75 mass %, the peak temperature of a Sn—Bi based alloy becomes 200° C. or above.

A Sn—Bi based alloy used in the present invention includes an alloy to which other elements have been added to this binary alloy. Examples of other elements include Ag, Cu, Ni, Cr, and Fe which are added with the object of improving the mechanical properties of the binary alloy, Ge and P which are added with the object of preventing surface oxidation of low melting point particles, and Zn which is added with the object of increasing wettability with respect to conductors. The added amount of other elements which are added to a Sn—Bi based alloy is at most 2 mass % of at least one type. If the added amount exceeds 2 mass %, the peak temperature becomes higher than 200° C., the solidus temperature becomes lower than 125° C., and wettability with respect to conductors is impaired.

Low melting point particles used in the present invention are preferably so-called mono-disperse particles having a uniform prescribed particle diameter. The low melting point particles can be made mono-disperse particles by controlling the method of manufacture of the low melting point particles or by classification of particles after manufacture. However, even if low melting point particles are made mono-disperse particles, particles having a particle diameter larger than a prescribed particle diameter are sometimes mixed in the particles. In this case, the particle diameter of low melting point particles larger than a prescribed particle diameter must be smaller than ¼ of the separation between adjoining conductors. This is because when a plurality of low melting point particles are laterally arranged in a row in the space between adjoining conductors and in contact with the conductors, even though it is almost impossible in actual practice for four low melting point particles to be arranged in a row, if it is assumed that four particles can be arranged in a row as a worst case scenario, a short circuit does not occur between adjoining conductors if the particle diameter of the four particles is smaller than ¼ of the distance between adjoining conductors. Therefore, in the present invention, the maximum diameter of low melting point particles having a large diameter which are mixed in the low melting point particles is smaller than ¼ of the distance between adjoining conductors.

Figure 5:
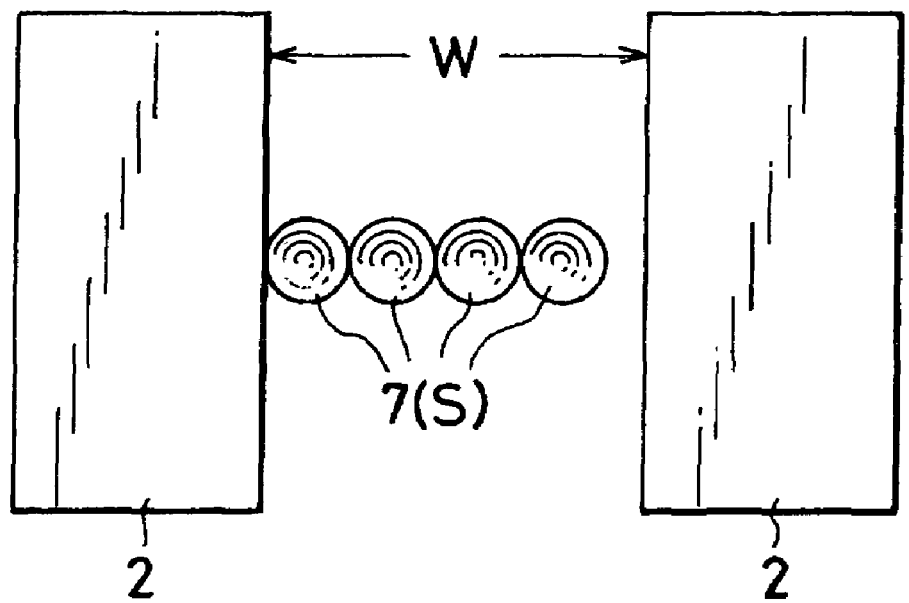
FIG. 5 is an explanatory view of an electrically conductive resin in a space between adjoining conductors in the present invention.
Figure 6:
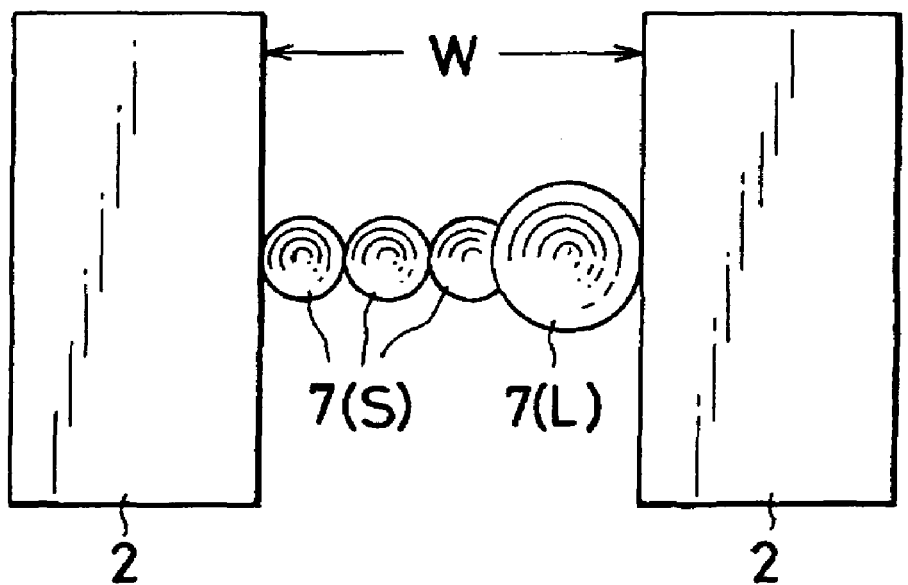
FIG. 6 is an explanatory view of the state in a space between adjoining conductors with a conventional electrically conductive resin.

Namely, in the case shown in FIG. 5 in which four low melting point particles 7(S) which are arranged in a row between conductors 2, 2 in the space 9 between adjoining conductors all have a diameter smaller than ¼ of the spacing W between the conductors 2, 2, the four low melting point particles do not form a short circuit between the conductors 2, 2. However, as shown in FIG. 6, if the particle diameter of three of the four low melting point particles 7(S) is smaller than ¼ of the spacing W but one particle 7(L) has a particle diameter which is larger than ¼ of the spacing W, the four conductive particles contact and form a short circuit between the conductors 2, 2. Therefore, in electric-conductive particles used in the present invention, the maximum particle diameter of electric-conductive particles having a large particle diameter is smaller than ¼ of the spacing between adjoining conductors.

For example, when the spacing between adjoining conductors is 150 μm, there are no problems if the largest diameter of large electric-conductive particles which are mixed in the particles is smaller than ¼ of 150 μm, i.e., if the particle diameter is smaller than 37.5 μm. Accordingly, even if four electric-conductive particles having a particle diameter of 35 μm are arranged in a row, their overall length is 140 μm, and a short circuit does not occur between adjoining conductors. However, if even one electrically conductive particle having a particle diameter larger than ¼ of the separation (37.5 μm) is present, the overall length becomes larger than the separation of 150 μm between adjoining conductors, and a short takes place between conductors.

If more than 10% of the total number of low melting point particles used in the present invention have a diameter which is 40% smaller than the prescribed particle diameter, small diameter low melting point particles become too numerous, and even if they are present between conductors, they do not contribute to conduction. In addition, a large number of these small particles are present between adjoining members, and the insulation resistance between adjoining members decreases. On the other hand, if the number of low melting point particles having a diameter 40% larger than the prescribed particle diameter of the low melting point particles exceeds 10% of the total number of particles, the number of large-diameter low melting point particles becomes too numerous, and the large-diameter particles cause short circuits between adjoining members or a decrease in insulation resistance.

A thermosetting resin used in the present invention is a synthetic resin which cures in a non-molten state and becomes a network-like structure due to heating, such as an epoxy resin, melamine resin, phenolic resin, urea resin, unsaturated polyester resin, alkyd resin, or urethane resin. A thermosetting resin may contain a filler to obtain a tough molding, or the curing temperature can be controlled by having the thermosetting resin contain a capsulated curing agent.

Examples of alloys for low melting point particles suitable for use in the present invention and examples of alloys which are unsuitable for low melting point particles are shown in Table 1.

TABLE 1

| | | Composition (mass %) | | | | | Solidus Temperature (° C.) $X1$ | Peak Temperature (° C.) $X2$ | Temperature Difference Between $X1$ and $X2$ (° C.) |
|---|---|---|---|---|---|---|---|---|---|
| | | Sn | Bi | In | Ag | Cu | Others | | | |
| Examples | 1 | Bal. | 1 | 14 | 2.75 | 0.4 | | 175 | 197 | 22 |
| | 2 | Bal. | | 14 | 2.75 | 0.4 | 0.04Ni | 177 | 198 | 21 |
| | 3 | Bal. | | 14 | 2.75 | 0.4 | | 176 | 198 | 22 |
| | 4 | Bal. | | 15 | 9 | | | 180 | 199 | 19 |
| | 5 | Bal. | | 22 | 9 | | | 134 | 198 | 64 |
| | 6 | Bal. | | 20 | 5 | | | 146 | 191 | 45 |
| | 7 | Bal. | | 22 | 3.5 | | | 130 | 187 | 57 |
| | 8 | Bal. | | 20 | 3.5 | | | 144 | 189 | 45 |
| | 9 | Bal. | | 20 | 3 | | | 144 | 189 | 45 |
| | 10 | Bal. | | 20 | 2.5 | | | 141 | 188 | 47 |
| | 11 | Bal. | | 20 | 2 | | | 141 | 190 | 49 |
| | 12 | Bal. | | 20 | 1.5 | | | 140 | 192 | 52 |
| | 13 | Bal. | | 20 | 1 | | | 140 | 194 | 54 |
| | 14 | Bal. | | 20 | 3.5 | | 0.01Co | 144 | 189 | 45 |
| | 15 | Bal. | | 20 | 3.5 | | 0.5Zn | 144 | 190 | 46 |
| | 16 | Bal. | 25 | | | | 0.01Ge | 139 | 194 | 55 |
| | 17 | Bal. | | 20 | 3.5 | | 0.01P | 144 | 189 | 45 |
| | 18 | Bal. | 25 | | | | | 139 | 194 | 55 |
| | 19 | Bal. | 40 | | | | | 139 | 169 | 30 |
| | 20 | Bal. | 65 | | | | | 139 | 165 | 26 |
| | 21 | Bal. | 75 | | | | | 139 | 198 | 59 |
| | 22 | Bal. | 25 | | 1.5 | | | 138 | 194 | 56 |
| | 23 | Bal. | 25 | | 1.5 | 0.4 | | 138 | 191 | 53 |
| | 24 | Bal. | 25 | | | 0.4 | 0.04Ni | 138 | 193 | 55 |
| | 25 | Bal. | 25 | | | | 1Zn | 130 | 190 | 60 |
| | 26 | Bal. | 25 | | | | 0.01Ge | 139 | 194 | 55 |
| | 27 | Bal. | 25 | | | | 0.01P | 139 | 194 | 55 |
| | 28 | Bal. | 25 | | | | 0.01Co | 139 | 194 | 55 |
| | 29 | Bal. | 8 | 5 | 3 | 0.5 | | 150 | 200 | 50 |
| | 30 | Bal. | 10 | 5 | 2.5 | | | 139 | 199 | 60 |
| | 31 | Bal. | 5 | 10 | 6 | 0.4 | | 146 | 197 | 51 |
| | 32 | Bal. | 3 | 10 | 6 | | | 164 | 200 | 36 |
| | 33 | Bal. | 10 | 3 | 3 | 0.5 | | 155 | 200 | 45 |
| | 34 | Bal. | 25 | 3 | 3 | 1 | | 125 | 181 | 56 |
| | 35 | Bal. | 13 | 3 | 2.8 | 0.4 | | 140 | 198 | 58 |
| | 36 | Bal. | | 15 | | | 8Zn | 150 | 174 | 24 |
| | 37 | Bal. | | 15 | | | 4Zn | 156 | 180 | 24 |
| | 38 | Bal. | | 13 | | | 10Zn | 157 | 175 | 18 |
| Comparative Examples | 1 | Bal. | | | | | 37Pb | 183 | 183 | 0 |
| | 2 | Bal. | | | 3.5 | | | 221 | 221 | 0 |
| | 3 | Bal. | | 52 | | | | 117 | 117 | 0 |
| | 4 | Bal. | 58 | | | | | 139 | 139 | 0 |
| | 5 | Bal. | | | 3 | | 0.5Cu | 217 | 221 | 4 |
| | 6 | Bal. | | 23 | | | | 117 | 193 | 76 |
| | 7 | Bal. | | 23 | 3.5 | | | 114 | 185 | 71 |
| | 8 | Bal. | | 12 | 3.5 | | | 185 | 205 | 20 |
| | 9 | Bal. | | 14 | 0.5 | 0.4 | | 171 | 203 | 32 |
| | 10 | Bal. | 25 | | 3.5 | | | 114 | 181 | 67 |
| | 11 | Bal. | 28 | | 1 | | | 114 | 178 | 64 |
| | 12 | Bal. | 30 | | 3 | | | 114 | 190 | 76 |
| | 13 | Bal. | | 15.5 | | 0.4 | | 181 | 208 | 27 |
| | 14 | Bal. | | 20 | 15 | | | 161 | 330 | 169 |
| | 15 | Bal. | | 15 | | | | 182 | 208 | 26 |
| | 16 | Bal. | | 10 | | | | 200 | 214 | 14 |
| | 17 | Bal. | 10 | | | | | 139 | 221 | 82 |
| | 18 | Bal. | 20 | | | | | 139 | 206 | 67 |
| | 19 | Bal. | 47 | | | | | 139 | 153 | 14 |
| | 20 | Bal. | 50 | | | | | 139 | 149 | 10 |
| | 21 | Bal. | 58 | | | | | 139 | 140 | 1 |
| | 22 | Bal. | 60 | | | | | 139 | 153 | 14 |
| | 23 | Bal. | 80 | | | | | 139 | 218 | 79 |
| | 24 | Bal. | | | | | 95Pb | 270 | 312 | 42 |
| | 25 | Bal. | | 8 | 3.5 | | | 198 | 208 | 10 |
| | 26 | Bal | | 10 | 3 | 0.5 | | 192 | 204 | 12 |
| | 27 | Bal. | 7 | 10 | 3 | 0.5 | | 122 | 195 | 73 |
| | 28 | Bal. | | 8 | 3 | 0.5 | | 169 | 204 | 35 |
| | 29 | Bal. | 30 | 3 | 3 | 0.5 | | 124 | 172 | 48 |
| | 30 | Bal. | 25 | 5 | 3 | 0.5 | | 119 | 176 | 57 |
| | 31 | Bal. | | 20 | | | 8Zn | 116 | 167 | 51 |

TABLE 1-continued

|  |  | Contact Resistance (Out of 20 Samples) ※3 | | | Insulation Resistance (Out of 20 Samples) ※4 | | | |
| --- | --- | --- | --- | --- | --- | --- | --- | --- |
|  |  | less than 10 Ω | 10 Ω~1 kΩ | more than 1 kΩ | less than $10^{-6}$ Ω | $10^{-6}$ Ω~0.1 Ω | more than 0.1 Ω | Remarks |
| Examples | 1 | 20 | — | — | 20 | — | — |  |
|  | 2 | 20 | — | — | 20 | — | — |  |
|  | 3 | 20 | — | — | 20 | — | — |  |
|  | 4 | 20 | — | — | 20 | — | — |  |
|  | 5 | 20 | — | — | 20 | — | — |  |
|  | 6 | 20 | — | — | 20 | — | — |  |
|  | 7 | 20 | — | — | 20 | — | — |  |
|  | 8 | 20 | — | — | 20 | — | — |  |
|  | 9 | 20 | — | — | 20 | — | — |  |
|  | 10 | 20 | — | — | 20 | — | — |  |
|  | 11 | 20 | — | — | 20 | — | — |  |
|  | 12 | 20 | — | — | 20 | — | — |  |
|  | 13 | 20 | — | — | 20 | — | — |  |
|  | 14 | 20 | — | — | 20 | — | — |  |
|  | 15 | 20 | — | — | 20 | — | — |  |
|  | 16 | 20 | — | — | 20 | — | — |  |
|  | 17 | 20 | — | — | 20 | — | — |  |
|  | 18 | 20 | — | — | 20 | — | — |  |
|  | 19 | 20 | — | — | 20 | — | — |  |
|  | 20 | 20 | — | — | 20 | — | — |  |
|  | 21 | 20 | — | — | 20 | — | — |  |
|  | 22 | 20 | — | — | 20 | — | — |  |
|  | 23 | 20 | — | — | 20 | — | — |  |
|  | 24 | 20 | — | — | 20 | — | — |  |
|  | 25 | 20 | — | — | 20 | — | — |  |
|  | 26 | 20 | — | — | 20 | — | — |  |
|  | 27 | 20 | — | — | 20 | — | — |  |
|  | 28 | 20 | — | — | 20 | — | — |  |
|  | 29 | 20 | — | — | 20 | — | — |  |
|  | 30 | 20 | — | — | 20 | — | — |  |
|  | 31 | 20 | — | — | 20 | — | — |  |
|  | 32 | 20 | — | — | 20 | — | — |  |
|  | 33 | 20 | — | — | 20 | — | — |  |
|  | 34 | 20 | — | — | 20 | — | — |  |
|  | 35 | 20 | — | — | 20 | — | — |  |
|  | 36 | 20 | — | — | 20 | — | — |  |
|  | 37 | 20 | — | — | 20 | — | — |  |
|  | 38 | 20 | — | — | 20 | — | — |  |
| Comparative Examples | 1 | 4 | 5 | 11 | 8 | 1 | 11 | Small T.D. |
|  | 2 | 3 | 3 | 14 | 5 | 1 | 14 | Small T.D. |
|  | 3 | 3 | 2 | 15 | 3 | 1 | 16 | Small T.D. |
|  | 4 | 1 | 4 | 15 | 2 | 4 | 14 | Small T.D. |
|  | 5 | 1 | 2 | 17 | 2 | 2 | 16 | Small T.D. |
|  | 6 | 6 | 5 | 9 | 20 | — | — | Low S.T. |
|  | 7 | 11 | 4 | 5 | 20 | — | — | Low S.T. |
|  | 8 | 15 | 3 | 2 | 20 | — | — | High P.T. |
|  | 9 | 18 | 1 | 1 | 20 | — | — | High P.T. |
|  | 10 | 5 | 3 | 12 | 20 | — | — | Low S.T. |
|  | 11 | 5 | 5 | 10 | 20 | — | — | Low S.T. |
|  | 12 | 2 | 4 | 14 | 20 | — | — | Low S.T. |
|  | 13 | 10 | 5 | 5 | 20 | — | — | High P.T. |
|  | 14 | 5 | 5 | 10 | 20 | — | — | High P.T. |
|  | 15 | 10 | 5 | 5 | 20 | — | — | High P.T. |
|  | 16 | 3 | 1 | 16 | 20 | — | — | High P.T. |
|  | 17 | 10 | 5 | 5 | 20 | — | — | High P.T. |
|  | 18 | 17 | 3 | — | 20 | — | — | High P.T. |
|  | 19 | 8 | 5 | 7 | 14 | 5 | 1 | Small T.D. |
|  | 20 | 7 | 10 | 3 | 6 | 10 | 4 | Small T.D. |
|  | 21 | 1 | 4 | 15 | 2 | 4 | 14 | Small T.D. |
|  | 22 | 8 | 7 | 5 | 7 | 7 | 6 | Smal T.D. |
|  | 23 | 12 | 7 | 1 | 20 | — | — | High P.T. |
|  | 24 | 3 | 2 | 15 | 20 | — | — | High P.T. |
|  | 25 | 3 | 2 | 15 | 12 | 4 | 4 | High P.T. |
|  | 26 | 10 | 5 | 5 | 13 | 5 | 2 | High P.T. and Small T.D. |

TABLE 1-continued

| | | | | | | | |
|---|---|---|---|---|---|---|---|
| 27 | 2 | 4 | 14 | 20 | — | — | Low S.T. |
| 28 | 10 | 5 | 5 | 20 | — | — | High P.T. |
| 29 | 2 | 5 | 13 | 20 | — | — | Low S.T. |
| 30 | 1 | 5 | 14 | 20 | — | — | Low S.T. |
| 31 | 10 | 4 | 6 | 20 | — | — | Low S.T. |

Note:
T.D.: temperature difference
S.T.: solidus temperature
P.T.: peak temperature The test methods for measuring contact resistance between conductors and insulation resistance between adjoining conductors after the environmental test in Table 1 were as follows.

Anisotropic Conductive Material 85 mass % of an epoxy resin (thermosetting resin), 5 mass % of a curing agent, and 10 mass % of low melting point particles were mixed to prepare an anisotropic electrically conductive film having a thickness of 40 μm.

Low melting point particles: The particles comprised the following particles with a predetermined diameter of 10 μm (maximum particle diameter of 35 μm).

Particles with a particle diameter of less than 6 μm (40% smaller than 10 μm): 8% (by number)

Particles having a particle diameter greater than 14 μm (40% greater than 10 μm): 8% (by number)

Particles with a diameter of 6-14 μm: remainder

An anisotropic electrically conductive film was sandwiched between a printed circuit board and a flexible printed circuit having a spacing of 150 μm between adjoining conductors, and thermocompression bonding was carried out using a thermocompression bonding apparatus for 1 minute at 200° C. at a pressure of 1-5 MPa per bonding area. 20 samples were tested for each alloy. After bonding, the samples were subjected to an environmental test from −40° C. to +125° C. (holding for 30 minutes at each temperature, 500 cycles), and then the connection resistance between the upper and lower conductors and the insulation resistance between adjoining conductors were measured.

Explanation of Table 1

*3 Connection resistance between conductors after the environmental test

At most 10Ω: The connection resistance which does not worsen performance in typical electronic equipment Greater than 10Ω to 1 kΩ: A state in which there is partial lack of connection between conductors at one location Great than 1 KΩ: A state in which there is almost no connection between conductors at one location

*4 Insulation resistance between adjoining conductors after the environmental test At least $10^6$Ω: The value of insulation resistance which does not worsen performance in typical electronic equipment.

Less than $10^6$Ω-0.1Ω: A state in which the insulation resistance has locally decreased.

Less than 0.1Ω: A state in which insulation is extremely poor.

As can be seen from Table 1, an anisotropic electrically conductive film manufactured from preferred alloys had suitable values of connection resistance between conductors and insulation resistance between adjoining conductors for all 20 samples. However, for anisotropic electrically conductive films which were manufactured using inappropriate alloys, among the 20 samples, there were samples which had a high value of connection resistance between conductors or low insulation resistance between adjoining conductors.

Industrial Applicability

The above examples are of an anisotropic conductive material in the form of a film, but the present invention can be applied not only to a film but also to a paste containing a thermosetting resin which is liquid at room temperature.

The invention claimed is:

1. An anisotropic conductive material comprising electrically conductive alloy particles comprising Sn and at least one of Bi, In, Ag, and Cu in a thermosetting resin, the electrically conductive particles being low melting point particles having a solidus temperature of at least 125° C., a peak temperature of at most 200° C., and a temperature difference between the solidus temperature and the peak temperature of at least 15° C.

2. An anisotropic conductive material as claimed in claim 1 wherein the low melting point particles are made of an alloy comprising 13-22 mass % of In, 1 -9 mass % of Ag, and a remainder of Sn and having a solidus temperature of at least 125° C., a peak temperature of at most 200° C., and a temperature difference between the solidus temperature and the peak temperature of at least 15° C.

3. An anisotropic conductive material as claimed in claim 2 wherein the alloy contains at least one of Cu, Ni, Co, P, Ge, and Zn in a total amount of at most 1 mass %, 4. An anisotropic conductive material as claimed in claim 1 wherein the low melting point particles are made of an alloy comprising 25-75 mass % of Bi and a remainder of Sn and having a solidus temperature of at least 125° C., a peak temperature of at most 200° C., and a temperature difference between the solidus temperature and the peak temperature of at least 15° C.

5. An anisotropic conductive material as claimed in claim 4 wherein the alloy contains 65-75 mass % of Bi.

6. An anisotropic conductive material as claimed in claim 4 wherein the alloy contains 25-40 mass % of Bi.

7. An anisotropic conductive material as claimed in claim 4 wherein the alloy contains at least one of Ag, Cu, Ni, Co, P, Ge, and Zn in a total amount of at most 2 mass %.

8. An anisotropic conductive material as claimed in claim 1 wherein the electrically conductive particles have a maximum particle diameter which is less than ¼ of the spacing between adjoining conductors atop which the anisotropic conductive material is to be disposed.

9. An anisotropic conductive material as claimed in claim 1 wherein at most 10% of the total number of electrically conductive particles have a particle diameter which is at least 40% smaller than a prescribed diameter and at most 10% of the total number of electrically conductive particles have a particle diameter which is at least 40% larger than the prescribed diameter.

10. An anisotropic conductive material as claimed in claim 1 wherein the thermosetting resin begins to cure at 200° C. or below.

11. A substrate assembly comprising a first substrate having a plurality of conductors, a second substrate having a plurality of conductors each opposing one of the conductors of the first substrate, and an anisotropic conductive material as claimed in claim 8 disposed between the first and second substrates, the electrically conductive particles in the anisotropic conductive material having a particle diameter which is less than ¼ of a spacing between adjoining conductors on the first and second substrates.

* * * * *

UNITED STATES PATENT AND TRADEMARK OFFICE
CERTIFICATE OF CORRECTION

| | |
|---|---|
| PATENT NO. | : 8,343,383 B2 |
| APPLICATION NO. | : 12/450126 |
| DATED | : January 1, 2013 |
| INVENTOR(S) | : Minoru Ueshima |

It is certified that error appears in the above-identified patent and that said Letters Patent is hereby corrected as shown below:

Column 16, line 3 (claim 11, line 5), change "claim 8" to --claim 1--.

Signed and Sealed this
Nineteenth Day of February, 2013

Teresa Stanek Rea
*Acting Director of the United States Patent and Trademark Office*